(12) United States Patent
Chen et al.

(10) Patent No.: US 6,228,209 B1
(45) Date of Patent: May 8, 2001

(54) EQUIPMENT FOR FORMING A GLUE LAYER OF AN OPENING

(75) Inventors: Coming Chen, Taoyuan Hsien; Juan-Yuan Wu, Hsinchu; Water Lur, Taipei, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/174,993

(22) Filed: Oct. 19, 1998

(30) Foreign Application Priority Data

Jul. 20, 1998 (TW) .................................................. 87111777

(51) Int. Cl.[7] ...................................................... C23F 1/02
(52) U.S. Cl. ........................................ 156/345; 204/192.3
(58) Field of Search ............................... 118/719, 723 E, 118/723 I, 727; 156/345; 204/192.3, 192.35

(56) References Cited

U.S. PATENT DOCUMENTS 5,135,608 * 8/1992 Okutani ................................ 156/643
5,667,592 * 9/1997 Boitnott et al. ...................... 118/719
5,882,488 * 3/1999 Leiphart ............................ 204/192.32

* cited by examiner

Primary Examiner—Richard Bueker
Assistant Examiner—Enh Fieler
(74) Attorney, Agent, or Firm—Thomas, Kayden, Horstemeyer & Risley

(57) ABSTRACT

A fabrication equipment to form an opening plug is provided. The equipment at least includes a load/unload chamber, a degas chamber, an usual sputtering chamber, a radio frequency (RF) sputtering chamber, a physical vapor deposition (PVD) chamber, and a chemical vapor deposition (CVD). The load/unload chamber is used to load a substrate. The degas chamber is used to remove moisture on the substrate. The usual sputtering chamber is used to form an opening on the substrate. The PVD chamber is used to form a first glue layer. The RF sputtering chamber is used to remove an overhang structure on the first glue layer. The CVD chamber is used to form a second glue layer over the first glue layer.

21 Claims, 4 Drawing Sheets

US 6,228,209 B1

EQUIPMENT FOR FORMING A GLUE LAYER OF AN OPENING

CROSS-REFERENCE TO RELATED APPLICATION

This application claims the priority benefit of Taiwan application Ser. No. 87111777, filed Jul. 20, 1998, the full disclosure of which is incorporated herein by reference.

BACKGROUND OF THE INVENTION

1. Field of the Invention

This invention relates to an equipment of semiconductor fabrication, and more particularly to an equipment for forming a glue layer over an opening in order to round an upper corner of the opening.

2. Description of Related Art

Currently, semiconductor devices are widely involved in many products and services in our daily life. All these semiconductor devices are fabricated on a wafer through many processes, such as photolithography, deposition, ion implantation, or etching, to form an integrated circuit (IC) device. One wafer usually includes a large number of IC devices.

In semiconductor fabrication on a wafer, or called a substrate, an opening with high aspect ratio, which is defined as a ratio of the depth to the width, is needed in some situations. The opening, such as a via opening or a contact opening, is formed in a dielectric layer and is filled with a metallic material, such as tungsten, to form a metal plug. The dielectric layer is usually sandwiched between two metal layers or between one metal layer on the top and the substrate on the bottom. The purpose of the metal plug is to interconnect these two metal layers for an interconnection between device elements. Since the material properties of the metal plug and the dielectric layer are different, there usually is a poor adhesion between them at the sidewall of the opening. In order to improve the adhesion between the metal plug and the dielectric layer, a conformal glue layer, or called barrier layer, is usually formed over the opening before the metal plug is filled into the opening. The glue layer can improve adhesion of the metal plug in the dielectric layer.

Currently, the glue layer typically includes a mix layer of titanium and titanium nitride as shown in FIG. 1A and FIG. 1B, which are cross-sectional views, illustrating a fabrication process of an conventional opening plug. In FIG. 1A, a dielectric layer 102 is formed on a substrate 100. An opening 104 is formed in the dielectric layer 102. A titanium layer 106 is formed over the substrate 100 by physical vapor deposition (PVD) and a titanium nitride layer 108 is formed over the titanium layer 106 by chemical vapor deposition (CVD). The titanium layer 106 and the titanium nitride layer 108 form together as a glue layer, which is conformal to the substrate 100. Since a high integration IC device is desired, the aspect ratio of the opening is usually high, which degrades the step coverage performance. The titanium layer 106 formed by PVD may have an overhang 106a at each upper corner 102a of the opening 104.

In FIG. 1B, a tungsten metal layer 110 is formed over the substrate 100 to fill the opening 104 of FIG. 1A. Since the existence of the overhang 106a, the step coverage performance is also poor. A void 112 is formed within the opening 104. The void 112 can induce some problems, such as current leakage, and cause a failure of the device.

The fabrication processes described above are performed in a fabrication equipment. FIG. 2 is a schematic drawing of a conventional fabrication equipment for metallization process. In FIG. 2, the substrate (not shown) is put in a load/unload chamber 202. The substrate, sequentially following the arrow direction 204, is put in a degas chamber 206 to remove remaining water vapor on the substrate, in a sputtering chamber 208 to form the opening, in a PVD chamber 210 to deposit the titanium layer 106 of FIG. 1B, and in a CVD chamber 212 to deposit the titanium layer 108 of FIG. 1B.

In this conventional fabrication equipment, there is no chamber for removing the overhang 106a of FIG. 1B. If the overhang 106 is not removed, the step coverage performance on the opening 104 is then not improved.

SUMMARY OF THE INVENTION

It is therefore an objective of the present invention to provide a fabrication equipment to form an opening plug, which includes a glue layer without an overhang structure on each upper sharp corner of the opening. A void inside the opening plug is effectively avoided.

It is another an objective of the present invention to provide a fabrication equipment to form an opening plug. The equipment allows a portion of the glue layer on the upper sharp corner of the opening to be rounded so as to improve step coverage performance for a high aspect ratio opening.

In accordance with the foregoing and other objectives of the present invention, a fabrication equipment to form an opening plug is provided. The equipment at least includes a load/unload chamber, an usual sputtering chamber, a radio frequency (RF) sputtering chamber, a physical vapor deposition (PVD) chamber, and a chemical vapor deposition (CVD). The load/unload chamber is used to load a substrate. The usual sputtering chamber is used to form an opening on the substrate. The PVD chamber is used to form a first glue layer. The RF sputtering chamber is used to remove an overhang structure on the first glue layer. The CVD chamber is used to form a second glue layer over the first glue layer. The RF sputtering chamber is the main characteristic of the invent so as to improve a step coverage performance. Moreover, in order to avoid moisture to deteriorate the fabrication, a degas chamber is preferable further included before starting the usual sputtering chamber to remove moisture remaining on the substrate before fabrication.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

A glue layer can improve adhesion between metal plug and dielectric. In order to further improve ohmic contact, a conformal metal layer is also included in the glue layer. So a glue layer is usually composed of titanium/titanium-nitride. In conventional process, the titanium layer is formed by physical vapor deposition (PVD). If the width of an opening is reduced, an overhang overhang is very possibly occurs on upper corners of the opening and may causes a void existing inside a metal plug that subsequently fills the opening. The void can reduce device performance or even cause a failure of a device.

In order to effectively prevent the void from occurring, the invention includes a radio-frequency (RF) sputtering process after forming the titanium layer to remove the overhang structure. This ensures a better step coverage performance so that a void in plug can be effectively avoided.

Figure 3A:
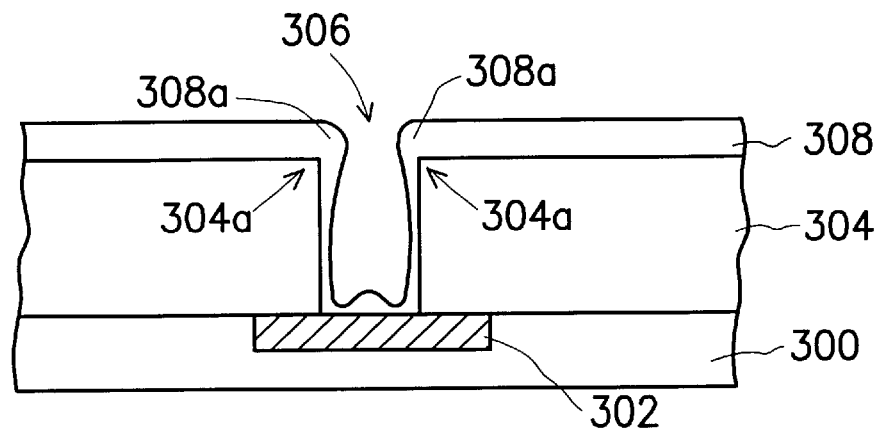
FIGS. 3A–3C are cross-sectional views, schematically illustrating a fabrication process of an opening plug without overhang structure, according to a preferred embodiment of the invention.
Figure 3B:
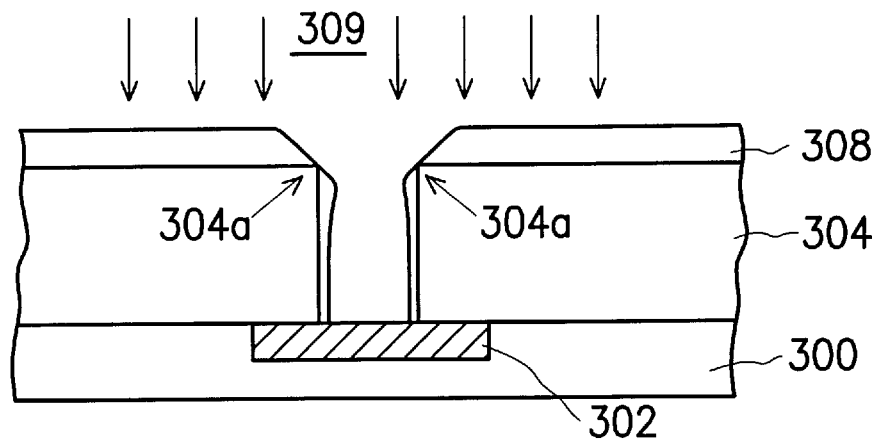
Figure 3C:
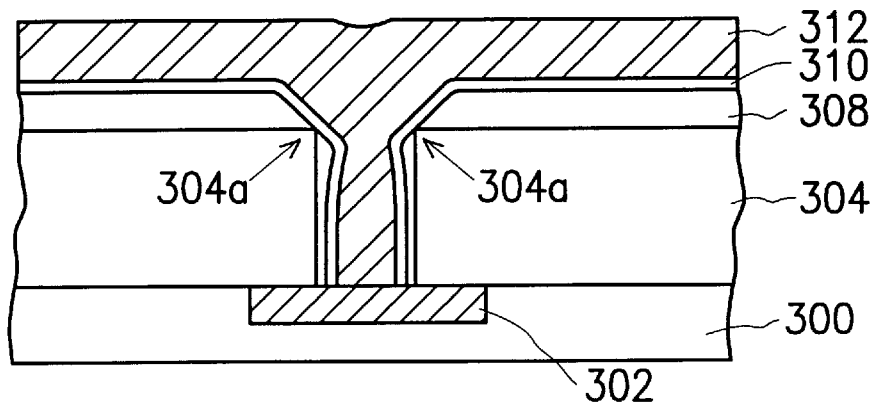

FIGS. 3A–3C are cross-sectional views, schematically illustrating a fabrication process of an opening plug without overhang structure, according to a preferred embodiment of the invention. In FIG. 3A, the process starts from a substrate 300, which has some structures (not shown) been fabricated. For example, a metallic structure 302 is formed in the substrate 300. A dielectric layer 304 is formed over the substrate. An opening 306 exposing the metallic structure 302 is formed in the dielectric layer by, for example, photolithography and etching. A glue layer 308 conformal to the substrate 300 is formed so that a surface of the opening is at least covered. The glue layer 308 includes, for example, titanium and is formed by PVD. The opening 306 is, for example, a high aspect ratio opening. The width of the opening is relative small to the depth. An overhang structure 308a is usually formed on each upper corner 304a of the opening 306. The overhang structure 308a may degrade the step coverage performance for the subsequent process for a formation of a plug.

In FIG. 3B, a RF sputtering process is preferably performed to remove the overhang structure 308a of FIG. 3A. The RF sputtering process includes a gas, such as nitrogen gas, flushed into a reaction chamber, and a RF power source used to ionize the gas into ions 309. The substrate 300 is applied a voltage to produce electric field, which energizes ions 309 by accelerating ions 309 in order to bombard the substrate 300. The overhang structure 306a of FIG. 3A is removed. In addition, a portion of the glue layer 308 at the bottom of the opening 306 of FIG. 3A is also removed. The opening 308 exposes the metallic structure 302 again. The portion of the glue layer 308 above the dielectric layer 304 basically remains the same because there is no sufficient electric field at there, and this portion is to be removed when a plug is accomplished. This RF sputtering process is the main characteristic in the invention. The glue layer 308 can increase ohmic contact.

Figure 1A:
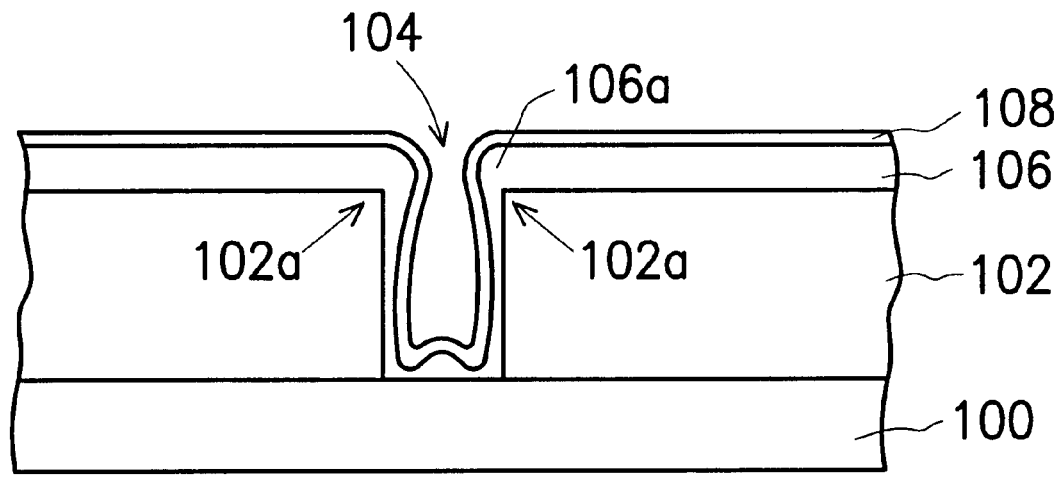
FIG. 1A and FIG. 1B are cross-sectional views, illustrating a fabrication process of an conventional opening plug.
Figure 1B:
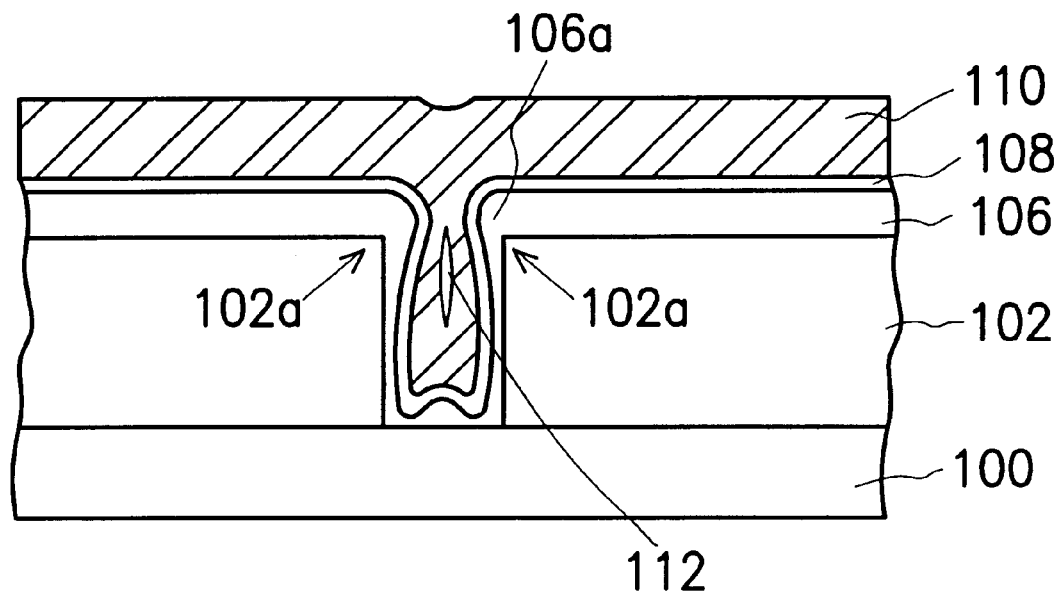
Figure 2:
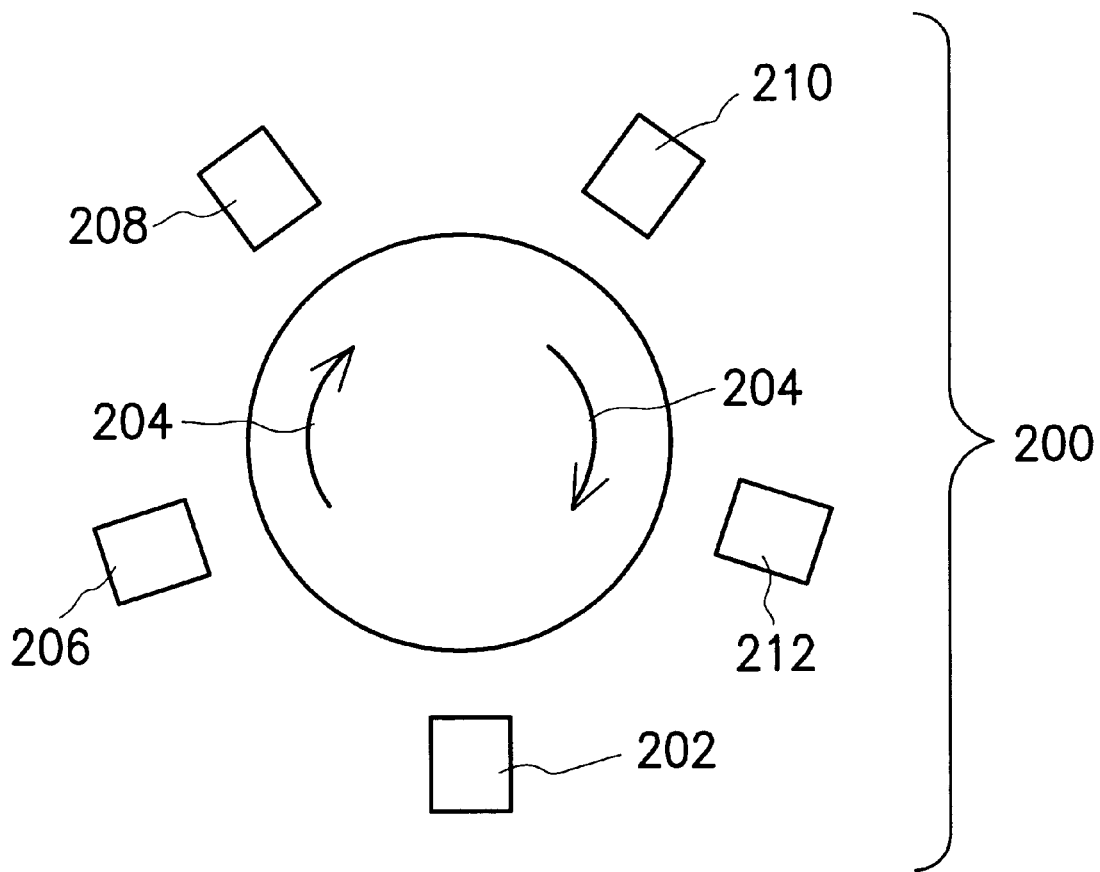
FIG. 2 is a schematic drawing of a conventional fabrication equipment for forming a glue layer on an opening.

In FIG. 3C, a conformal glue layer 310 including, for example, titanium nitride is formed over the substrate 300. The formation of the glue layer 310 includes chemical vapor deposition (CVD). Since the CVD process has better step coverage, the glue layer 310 has no overhang structure and is conformal to the surface of the substrate 300 with a sufficiently uniform thickness. A conductive layer 312 then is deposited over the substrate 300 to at least fill the opening 306 of FIG. 3A. The conductive layer 312 includes, for example, tungsten. There is no void like the void 112 of FIG. 1B inside the conductive layer within the opening. The rest fabrication processes to accomplish a plug is well known by those skilled in the art and is not further described here.

The method described above to form the glue layer 308 is suitable for any kind of opening, such as via opening, contact opening, or damascene opening, and more particular to via opening and contact opening. All these kinds of opening have a contact between dielectric layer and the subsequently formed metal layer (plug). The avoidance of the overhang structure of the glue layer on the upper corners of the opening can improve the step coverage performance so that device performance can be maintained as desired by an IC design. A yield rate can be effectively increased.

Figure 4:
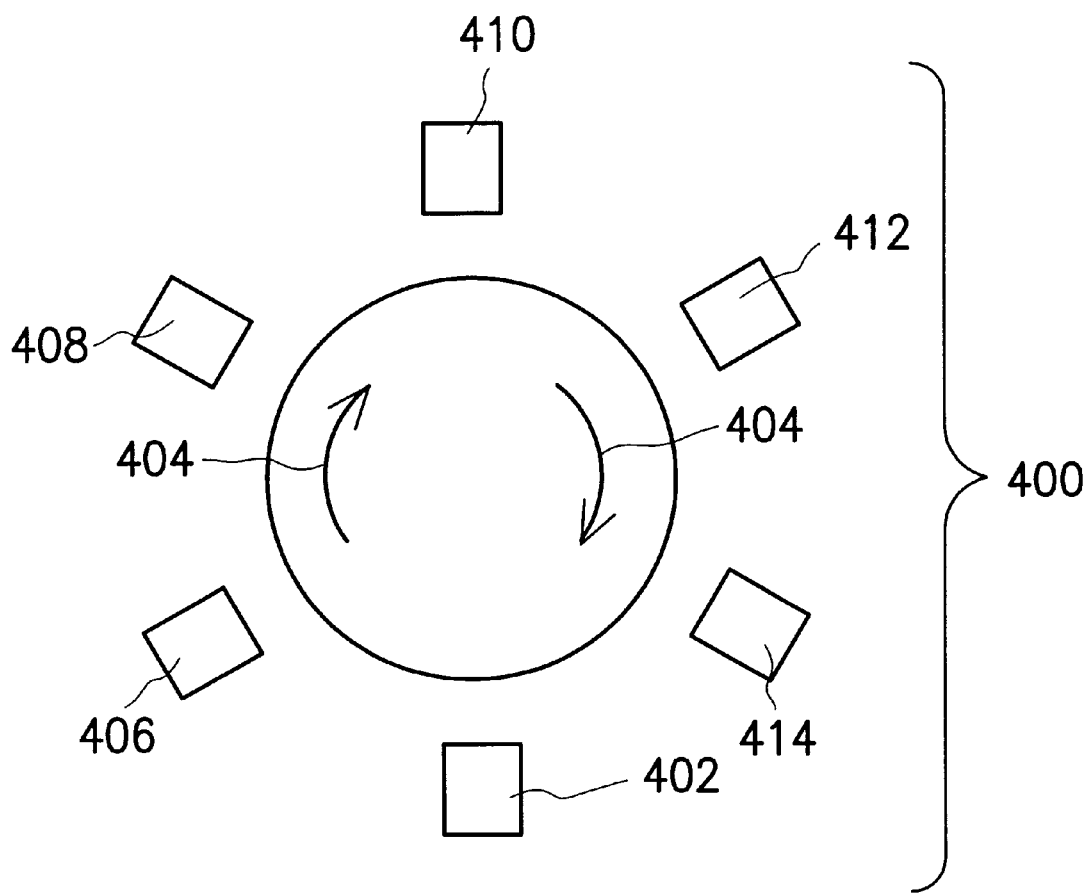
FIG. 4 is a schematic drawing of a fabrication equipment for forming a glue layer on an opening without overhang structure.

In accordance with the method of the invention to form a glue layer without overhang structure, a fabrication equipment 400 is proposed as shown in FIG. 4, which is a schematic drawing of a fabrication equipment for forming a glue layer on an opening without overhang structure. In FIG. 4, a substrate (not shown) is first loaded in a load/unload chamber 402. The substrate, sequentially following the arrow direction 404, is put in a degas chamber 406, an usual sputtering chamber 408, a PVD chamber 410, a RF sputtering chamber 412, and a CVD chamber 414. The degas chamber 406 is used to remove water vapor possibly remaining on the substrate. The usual sputtering chamber 408 is used to form the opening. The PVD chamber 410 is used to deposit the titanium layer 308 of FIG. 3A. The RF sputtering chamber 412 is used to remove the overhang structure 308a for the process shown in FIG. 3B. This is the main characteristic of the invention. The CVD chamber 414 is used to deposit the titanium nitride layer 310 of FIG. 3C. The rest fabrication processes to accomplish a plug is well known by those skilled in the art and is not further described here. When the substrate is put in the load/unload chamber 402, the whole equipment is closed and is vacuumed. The fabrication process, such as patterning, etching, deposition, and photolithography are preformed in an in-situ environment.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. An equipment for forming a glue layer over an opening formed in a dielectric layer on a substrate, the equipment comprising:

a physical vapor deposition chamber, wherein a glue layer is formed over an opening; and a radio-frequency (RF) sputtering chamber, wherein an overhang structure of the glue layer is removed subsequent to the formation of the glue layer in the physical vapor deposition chamber.

2. An equipment for forming a glue layer over an opening formed in a dielectric layer on a substrate, the equipment comprising a sequential order of:

a first sputtering chamber, used to form the opening;

a physical vapor deposition (PVD) chamber, inside of which the glue layer is formed, wherein an overhang structure in the glue layer on each upper corner of the opening is formed;

a second sputtering chamber, inside of which the overhang structure of the glue layer is removed so as to improve a step coverage performance for a subsequent deposition process; and a chemical vapor deposition (CVD) chamber, inside of which an additional glue layer is formed over the glue layer.

3. The equipment of claim 2, wherein the second sputtering chamber comprises a radio frequency power source to ionize a gas that is flushed in, and an bombardment on the substrate with the ionized gas.

4. The equipment of claim 2, wherein the glue layer comprises titanium.

5. The equipment of claim 2, wherein the addition glue layer comprises titanium nitride.

6. An equipment for forming a glue layer over an opening formed in a dielectric layer on a substrate, the equipment comprising:
- a load chamber, used to load the substrate into the equipment;
- a degas chamber, used to remove moisture on the substrate;
- a first sputtering chamber, used to form the opening on the substrate;
- a physical vapor deposition (PVD) chamber, used to form a first glue layer conformal to a substrate surface, wherein an overhang structure in the first glue layer on each upper corner of the opening is also formed;
- a second sputtering chamber, used to remove the overhang structure of the first glue layer so as to improve a step coverage performance for a subsequent deposition process; and
- a chemical vapor deposition (CVD) chamber, used to form a second glue layer over the first glue layer, wherein the first glue layer and the second glue layer form together as the glue layer.

7. The equipment of claim 6, wherein the second sputtering chamber comprises a radio frequency power source to ionize a gas which bombards the substrate.

8. The equipment of claim 6, wherein the first glue layer comprises titanium.

9. The equipment of claim 6, wherein the second glue layer comprises titanium nitride.

10. An equipment for forming a glue layer over an opening formed in a dielectric layer on a substrate, the equipment comprising:
- a load chamber, used to load the substrate into the equipment, wherein the equipment is vacuumed after loading;
- a first sputtering chamber, used to form the opening on the substrate;
- a physical vapor deposition (PVD) chamber, used to form a first glue layer conformal to a substrate surface, wherein an overhang structure in the glue layer on each upper corner of the opening is also formed;
- a second sputtering chamber, used to remove the overhang structure of the first glue layer so as to improve a step coverage performance for a subsequent deposition process; and
- a chemical vapor deposition (CVD) chamber, used to form a second glue layer over the first glue layer, wherein the first glue layer and the second glue layer form together as the glue layer;
- wherein the above chambers are arranged a sequential order as listed above.

11. The equipment of claim 10, wherein the second sputtering chamber comprises a radio frequency power source to ionize a gas that is flushed in, and an bombardment on the substrate with the ionized gas.

12. The equipment of claim 11, wherein between the load chamber and the first sputtering chamber, a degas chamber is further comprised in order to remove possible moisture on the substrate.

13. The equipment of claim 10, wherein the first glue layer comprises titanium.

14. The equipment of claim 10, wherein the second glue layer comprises titanium nitride.

15. An equipment for forming a glue layer over an opening formed in a dielectric layer on a substrate, the equipment comprising:
- a RF sputtering chamber, used to remove an overhang structure, which exists on the glue layer.

16. The equipment of claim 15, wherein the RF sputtering chamber is comprised in a plurality of fabrication chambers arranged in a sequential order, in which the fabrication chambers are following:
- a load chamber, used to load the substrate into the equipment;
- a degas chamber, used to remove moisture on the substrate;
- a first sputtering chamber, used to form the opening on the substrate;
- a physical vapor deposition (PVD) chamber, used to form a first glue layer conformal to a substrate surface, wherein the overhang structure in the glue layer on each upper corner of the opening is also formed;
- the RF sputtering chamber, used to remove the overhang structure of the first glue layer so as to improve a step coverage performance for a subsequent deposition process; and
- a chemical vapor deposition (CVD) chamber, used to form a second glue layer over the first glue layer, wherein the first glue layer and the second glue layer form together as the glue layer.

17. The equipment of claim 16, wherein the second sputtering chamber comprises a radio frequency power source to ionize a gas that is flushed in, and an bombardment on the substrate with the ionized gas.

18. The equipment of claim 16, wherein the first glue layer comprises titanium.

19. The equipment of claim 16, wherein the second glue layer comprises titanium nitride.

20. An equipment for semiconductor fabrication, wherein the equipment is applicable to the processing of forming a glue layer over an opening, comprising:
- an opening forming chamber;
- a first glue layer deposition chamber;
- an overhang glue structure removal chamber; and
- a second glue layer deposition chamber.

21. The equipment of claim 20, wherein the overhang glue removal chamber includes a radio-frequency sputtering chamber.

* * * * *